United States Patent
Kagami (10) Patent No.: US 11,187,747 B2
(45) Date of Patent: Nov. 30, 2021

(54) INSPECTION SYSTEM AND MALFUNCTION ANALYSIS/PREDICTION METHOD FOR INSPECTION SYSTEM

(71) Applicant: TOKYO ELECTRON LIMITED, Tokyo (JP)

(72) Inventor: Tetsuya Kagami, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 208 days.

(21) Appl. No.: 16/490,486

(22) PCT Filed: Jan. 30, 2018

(86) PCT No.: PCT/JP2018/002934
§ 371 (c)(1),
(2) Date: Aug. 30, 2019

(87) PCT Pub. No.: WO2018/159190
PCT Pub. Date: Sep. 7, 2018

(65) Prior Publication Data
US 2020/0011927 A1 Jan. 9, 2020

(30) Foreign Application Priority Data
Mar. 2, 2017 (JP) .............................. JP2017-039458

(51) Int. Cl.
*G01R 31/28* (2006.01)
*G01R 1/067* (2006.01)
(Continued)

(52) U.S. Cl.
CPC ......... *G01R 31/2891* (2013.01); *G01R 1/067* (2013.01); *G01R 31/26* (2013.01);
(Continued)

(58) Field of Classification Search
CPC .... G01R 31/2891; G01R 1/067; G01R 31/26; G01R 31/2831; G01R 35/00; H01L 21/67288; H01L 22/20
(Continued)

(56) References Cited

U.S. PATENT DOCUMENTS 10,998,204 B2 * 5/2021 Mochizuki ........ H01J 37/32724
11,004,717 B2 * 5/2021 Matsuyama ........ H01L 21/3065
(Continued)

FOREIGN PATENT DOCUMENTS

JP H10-78464 A 3/1998
JP 2000-243794 A 9/2000
(Continued)

OTHER PUBLICATIONS

PCT International Search Report and Written Opinion, PCT Application No. PCT/JP2018/002934, dated Apr. 3, 2018, 9 pages (with English translation of International Search Report).

*Primary Examiner* — Giovanni Astacio-Oquendo
(74) *Attorney, Agent, or Firm* — Fenwick & West LLP (57) ABSTRACT

An inspection system includes a prober, a tester and a malfunction analysis/prediction unit. The prober has a stage holding a substrate having multiple devices formed thereon, a transport unit that transfers the substrate to the stage, and a probe card that brings a plurality of probes into contact with electrodes of the multiple devices on the substrate. A tester applies electrical signals to the multiple devices on the substrate through the probe card and inspects electrical characteristics of the multiple devices. The malfunction analysis/prediction unit, when a malfunction or a sign indicating a stage leading to the malfunction has occurred during an inspection, analyzes history information of the prober and tester related to the malfunction to determine or predict a location of the malfunction.

16 Claims, 8 Drawing Sheets

(51) Int. Cl.
    *G01R 31/26* (2020.01)
    *H01L 21/67* (2006.01)
    *H01L 21/66* (2006.01)

(52) U.S. Cl.
    CPC .... *G01R 31/2831* (2013.01); *H01L 21/67288* (2013.01); *H01L 22/20* (2013.01)

(58) Field of Classification Search
    USPC ................................. 324/750.01, 537, 500
    See application file for complete search history.

(56) References Cited

U.S. PATENT DOCUMENTS

| | | | |
|---|---|---|---|
| 11,009,544 B2* | 5/2021 | Uchida | G01R 31/2889 |
| 2021/0033666 A1* | 2/2021 | Kasai | G01R 31/2875 |
| 2021/0063443 A1* | 3/2021 | Fujihara | G01R 31/2887 |
| 2021/0156901 A1* | 5/2021 | Yasuta | G01R 31/2601 |

FOREIGN PATENT DOCUMENTS

| | | |
|---|---|---|
| JP | 2003-258044 A | 9/2003 |
| JP | 2007-108078 A | 4/2007 |
| JP | 2007-108117 A | 4/2007 |
| JP | 2007-115945 A | 5/2007 |
| JP | 2007-235031 A | 9/2007 |
| JP | 2009-63477 A | 3/2009 |
| JP | 2009-216596 A | 9/2009 |
| JP | 2015-162574 A | 9/2015 |
| TW | 201545200 A | 12/2015 |
| WO | WO 2015/129157 A1 | 9/2015 |

* cited by examiner

INSPECTION SYSTEM AND MALFUNCTION ANALYSIS/PREDICTION METHOD FOR INSPECTION SYSTEM

TECHNICAL FIELD

The present invention relates to an inspection system for inspecting a target object to be inspected and a malfunction analysis/prediction method for the inspection system.

BACKGROUND

In a semiconductor device manufacturing process, electrical inspection of multiple devices (IC chips) formed on a semiconductor wafer (hereinafter, simply referred to as "wafer") is performed after all processes are performed on the wafer. An inspection system for performing such an electrical inspection generally includes a wafer stage, a wafer transfer system, a prober provided with a probe card having probes to be in contact with the devices formed on the wafer, and a tester for testing various electrical characteristics of the devices by applying electrical signals to the devices.

In this inspection system, it is required to quickly identify a cause of a malfunction when the malfunction has occurred to quickly deal with the malfunction. Further, it is also required to predict and avoid such a malfunction.

Patent document 1 discloses a technique for identifying a cause of a malfunction in a prober by using a self-diagnosis function of a controller of the prober.

PRIOR ART

Patent document 1: Japanese Patent Application Publication No. 2007-235031

However, the tester and the prober are manufactured by different manufacturers and integrated after they are delivered to customers. Further, the tester and the prober have diagnosis functions independent of each other.

In the case of analyzing the malfunction using the individual diagnosis functions of the tester and the prober, the prober may be diagnosed as FAIL (NG) due to a malfunction caused in the tester, or vice versa. In this case, even if each of the tester and the prober has the diagnosis function, it is difficult to identify the location of the malfunction. Further, it is also difficult to sufficiently predict the malfunction when the prober is diagnosed as FAIL (NG) due to the malfunction caused in the tester, or vice versa.

In view of the above, the present invention provides a technique capable of quickly identifying or predicting the malfunction location when the malfunction or a sign indicating a stage leading to the malfunction has occurred in the tester and the prober.

SUMMARY

In accordance with a first aspect of the present invention, there is provided an inspection system including: a prober including a stage configured to hold a substrate on which multiple devices are formed, a transport unit configured to transfer the substrate to the stage, and a probe card configured to bring a plurality of probes into contact with electrodes of the multiple devices on the substrate; a tester configured to apply electrical signals to the multiple devices on the substrate through the probe card to inspect electrical characteristics of the multiple devices; a malfunction analysis/prediction unit configured to analyze, when a malfunction or a sign indicating a stage leading to the malfunction has occurred during an inspection, history information of the probe and history information of the tester related to the malfunction to specify or estimate a location of the malfunction or predict the location of the malfunction.

In accordance with a second aspect of the present invention, there is provided a malfunction analysis/prediction method for identifying or predicting a location of a malfunction in an inspection system, the inspection system including a prober including a stage configured to hold a substrate on which multiple devices are formed, a transport unit configured to transfer the substrate to the stage, a probe card configured to bring a plurality of probes into contact with electrodes of the multiple devices on the substrate; and a tester configured to apply electrical signals to the multiple devices on the substrate through the probe card to inspect electrical characteristics of the multiple devices. The malfunction analysis/prediction method includes analyzing, when the malfunction or a sign indicating a stage leading to the malfunction has occurred during an inspection, history information of the prober and history information of the tester related to the malfunction to specify or estimate the location of the malfunction, or predict the location of the malfunction.

In the first aspect and the second aspect, the malfunction analysis/prediction unit may specify or estimate the location of the malfunction or predict the location of the malfunction based on the history information and an assessment of an operator. Further, when there are multiple causes of the malfunction, a cause of the malfunction may be specified based on the assessment of the operator to specify or estimate, or predict the location of the malfunction.

Further, the tester may include a motherboard, multiple inspection circuit boards mounted on the motherboard, and a contact member disposed between a probe card mounted on the prober and the motherboard to connect the probe card and the motherboard, and the location of the malfunction that has occurred in any one of the inspection circuit boards, the motherboard, the contact member, and the probe card may be specified or estimated, or predicted.

Further, when a contact failure or a malfunction due to a resistance of a transmission path from the tester to an inspection target object increasing has occurred during an inspection of the multiple devices formed on the substrate, multiple factors including factors of the prober side and factors of the tester side related to the contact failure or the malfunction are identified, and the location of the malfunction may be specified or estimated or the location of the malfunction may be predicted from, among the multiple factors, factors excluding factors already determined as normal and factors determined as normal by obtaining a normal result from predetermined diagnosis.

Further, an output result of an inspection item that is determined as 'PASS' during the inspection may be divided into multiple levels, a sign of the malfunction may be identified, and the malfunction may be predicted based on level changes caused by multiple measurement results for the inspection item. Further, the output result of the inspection item that is determined as 'PASS' during the inspection may be divided into the multiple levels on a map that displays the multiple devices formed on the substrate, and the location of the malfunction may be predicted based on a distribution of the levels of the devices determined as 'PASS.' Further, the location of the malfunction may be predicted by associating the distribution of the levels on the map with a variation in heights of the stage of an inspection target object of the prober.

In accordance with the aspects of the present invention, when the malfunction has occurred, the cause of the malfunction is specified based on the history information of the prober and the history information of the tester, so that it is possible to quickly specify or estimate the malfunction location. In addition, when a sign indicating a stage leading to the malfunction has occurred, it is possible to predict the malfunction location before the occurrence of the malfunction, which makes it possible to replace or repair target components in advance. Accordingly, the operation rate of the inspection system can be improved.

DETAILED DESCRIPTION

Hereinafter, embodiments will be described in detail with reference to the accompanying drawings.

<Inspection System>

Figure 1:
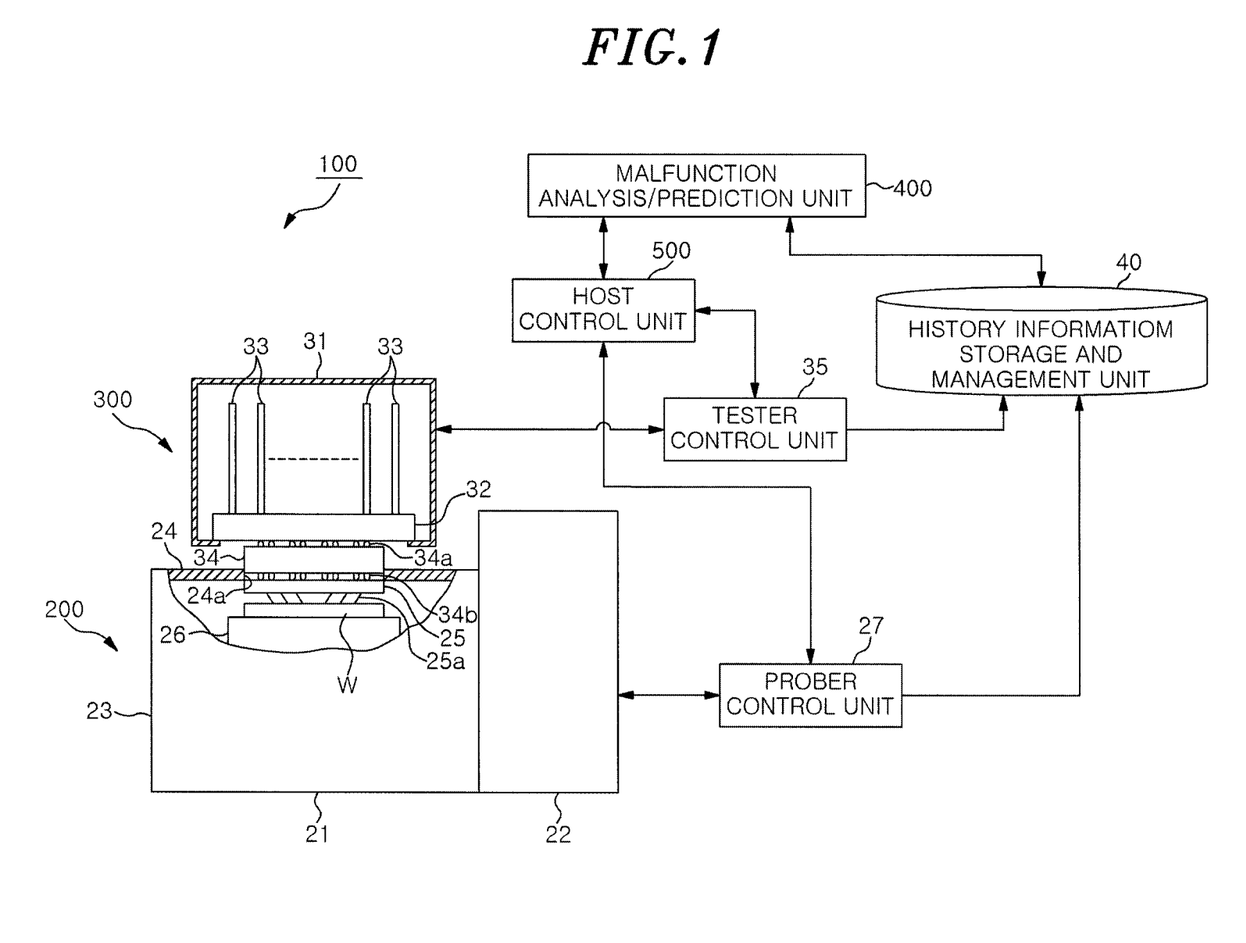
FIG. 1 schematically shows a configuration of an inspection system according to an embodiment of the present invention.

FIG. 1 schematically shows a configuration of an inspection system according to an embodiment of the present invention. The inspection system is configured to perform an electrical inspection of multiple devices (IC chips; hereinafter, also referred to as "Device Under Test (DUT)") formed on a wafer after all necessary processes are performed on the wafer.

As shown in FIG. 1, an inspection system 100 includes a prober 200 for bringing probes of a probe card into contact with devices on a wafer, a tester 300 for applying electrical signals to the devices to perform an electrical inspection, a malfunction analysis/prediction unit 400, and a host control unit 500.

The prober 200 includes a main body 21, a transport unit 22, and a prober control unit 27.

The main body 21 has a housing 23, a head plate 24 forming an upper surface of the housing 23 and having a circular hole 24a at a central portion thereof, a probe card installed at a position corresponding to the circular hole 24a of the head plate 24 and having a plurality of probes (contactors), and a stage (wafer chuck top) 26 positioned below the probe card 25 and configured to mount and attract the wafer W thereon. The stage 26 is movable in X-axis, Y-axis, Z-axis, and θ-axis directions by an X-Y table mechanism, a Z-direction moving mechanism, and a θ-direction moving mechanism (all not shown) to allow the wafer W to be positioned at a predetermined inspection position. The probes 25a of the probe card 25 are brought into contact with electrodes of the devices by raising the wafer W.

The transport unit 22 has a transfer device (not shown). A wafer carrier and a probe card stocker (both not shown) are installed on the transport unit 22. The transfer device transfers the wafer W from the wafer carrier onto the stage 26 and transfers the probe card 25 from the probe card stocker to a position below the head plate 24.

The prober control unit 27 includes a main controller having a CPU configured to control the respective components of the prober 200, an input unit such as a keyboard, a mouse, a remote controller or the like, an output unit such as a printer or the like, a display unit such as a display or the like, and a storage unit in which information required for the control is stored. The main controller sets a storage medium in which a processing recipe is stored in the storage unit to cause the prober 200 to perform a predetermined operation based on the processing recipe read out from the storage medium during inspection.

The tester 300 includes a housing 31, a motherboard 32 disposed horizontally at a bottom portion of the housing 31, multiple inspection circuit boards 33 mounted upright in slots of the motherboard 32, a contact block 34 for connecting the motherboard 32 with the probe card 25, and a tester control unit 35.

The motherboard 32 is connected to the probe card 25 through the contact block 34. The contact block 34 is connected to the motherboard 32 through multiple contact pins 34a and connected to the probe card 25 through multiple contact pins 34b. The contact pins 34a and 34b may be pogo pins. The inspection circuit boards 33 are configured to apply electrical signals to the devices formed on the wafer W depending on various test items.

The tester control unit 35 includes a main controller having a CPU configured to control the respective components of the tester 300, an input unit such as a keyboard, a mouse, a remote controller or the like, an output unit such as a printer or the like, a display unit such as a display or the like, and a storage unit in which information required for the control is stored. The main controller sets a storage medium in which a processing recipe is stored in the storage unit to cause the tester 300 to perform a predetermined operation based on the processing recipe read out from the storage medium during inspection.

Each of the prober control unit 27 and the tester control unit 35 includes a history information acquisition unit (not shown) configured to acquire history information (log data) such as an operation history of a system, a manipulation history of a user, a diagnosis history, or the like in order to identify a cause of a malfunction or deal with the malfunction at the time of occurrence of the malfunction. The history information acquired by the history information acquisition unit is stored in a history information storage and management unit 40.

The malfunction analysis/prediction unit 400 has artificial intelligence (AI) and configured to analyze a cause of the malfunction based on the information from the prober 200 or the tester 300 when the malfunction (FAIL) or a sign indicating a stage leading to the malfunction has occurred. When the malfunction location is unknown, the history information of the tester and the prober related to the malfunction that has occurred is acquired from the history information storage and management unit 40. Then, the malfunction location is determined (specified or estimated) or predicted based on the information and an assessment of an operator such as a service developer or the like.

Figure 2:
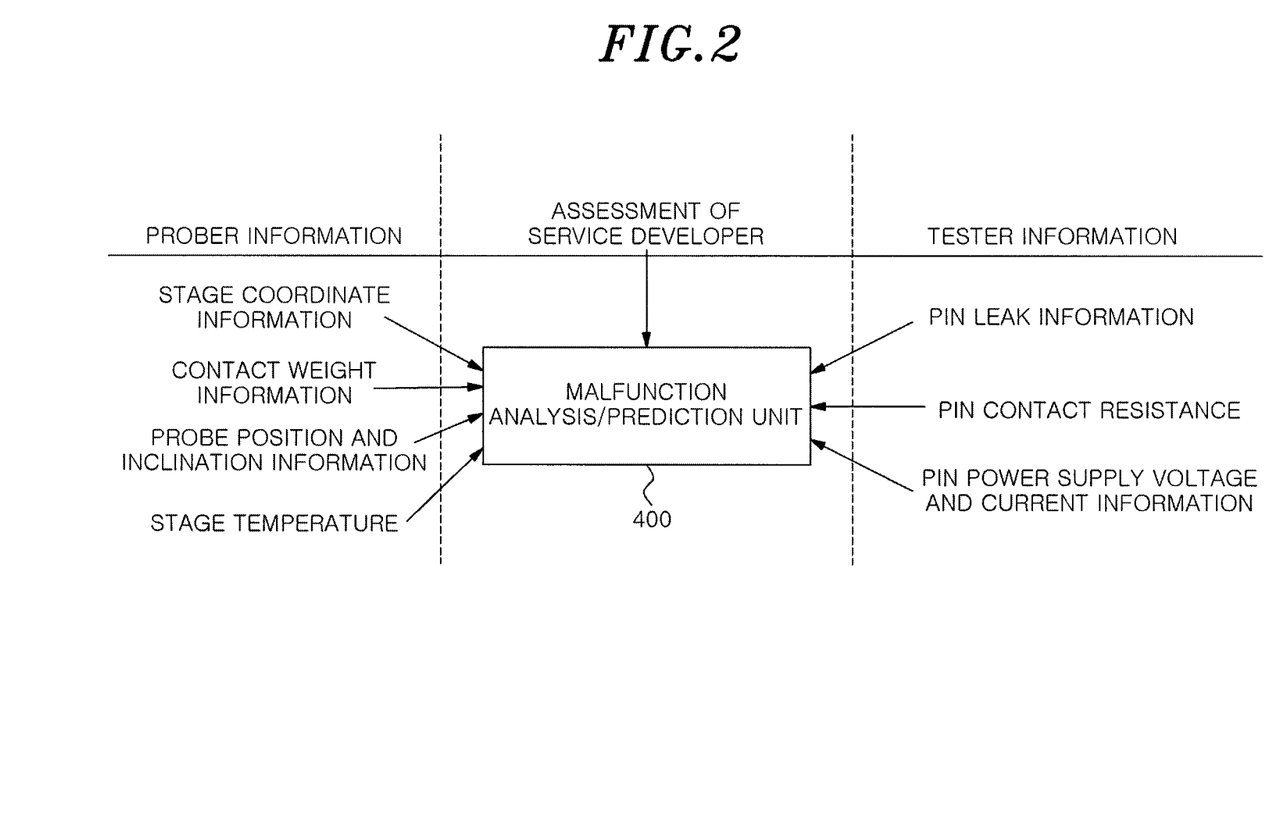
FIG. 2 shows a diagram explaining a malfunction analysis/prediction unit of the inspection system shown in FIG. 1.

As shown in FIG. 2, the malfunction analysis/prediction unit 400 is configured to obtain, as prober information, stage coordinate information, contact weight information, probe position and inclination information, and a stage temperature from the history information storage and management unit 40. Further, the malfunction analysis/prediction unit 400 is also configured to obtains, as tester information, pin leak information, a pin contact resistance, and a pin power supply voltage and current information from the history information storage and management unit 40.

The host control unit 500 includes a main controller having a CPU, an input unit such as a keyboard, a mouse, a remote controller or the like, an output unit such as a printer or the like, a display unit such as a display or the like, and a storage unit in which information required for the control is stored. The host control unit 500 is a higher-hierarchy control unit of the prober control unit 27 and the tester control unit 35. The host control unit 500 is configured to deliver information on the prober control unit 27 and the tester control unit 35, transmit the malfunction information to the malfunction analysis/prediction unit 400, receive the information on the cause of the malfunction (or the sign of the malfunction) from the malfunction analysis/prediction unit 400, and display the received information on the display unit.

<Inspection Method>

In the inspection system 100 configured as described above, the probe card 25 is installed by the transport unit 22 of the prober 200. Then, the wafer W in the carrier is transferred onto the stage 26 by the transport unit 22. In a state where the wafer W is vacuum-attracted on the stage 26, an electrical inspection of the wafer W is performed by the tester 300. At this time, the probe card 25 is electrically connected to the motherboard 32 through the contact block 34.

Figure 3:
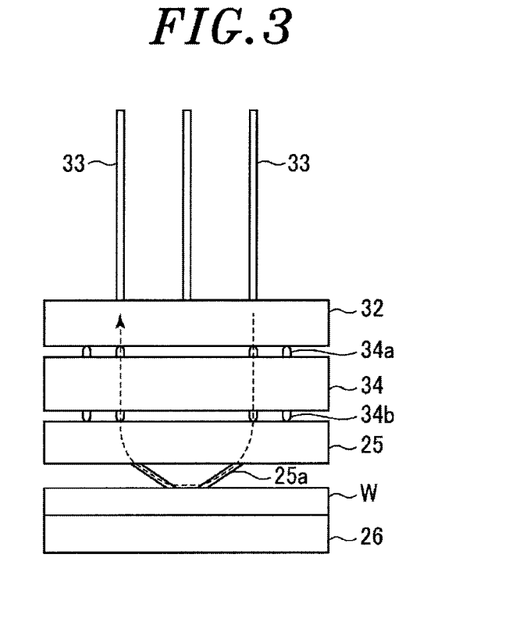
FIG. 3 shows a configuration from inspection circuit boards of a tester to a wafer.

During the inspection, the stage 26 is raised to bring the probes 25a of the probe card 25 into contact with the devices (DUTs) of the wafer W. Then, as shown in FIG. 3, the electric signals from the inspection circuit boards 33 reach the devices on the wafer W through the motherboard 32, the contact block 34 and the probe card 25, and return to the inspection circuit boards 33 through the probe card 25, the contact block 34, and the motherboard 32. Accordingly, the electrical characteristics of the devices are inspected.

Specifically, a voltage, a current, a logic waveform, and the like are outputted from the tester 300 to the devices on the wafer, and a voltage, a current, and a logic waveform from the devices are measured to determine PASS and NG of the devices.

Since the configuration from the inspection circuit boards 33 of the tester 300 to the wafer is as shown in FIG. 3, measurements of the devices on the wafer W are performed while including various factors such as tester measurement precision, a position of a contact portion, contact between the wafer W and the probes 25a, a position of the stage 26 (wafer chuck top), and the like.

Therefore, when the malfunction occurs in the above-described configuration shown in FIG. 3, measurement failure (malfunction) of the wafer occurs. However, in a conventional case, it is difficult to identify the cause of the malfunction. This is because, in the conventional case, the tester information and the prober information are separately managed and, thus, it is difficult to identify the cause of the malfunction when one of the tester and the prober causes the failure (malfunction) of the other. Further, although it is desireable to predict the malfunction to deal with the malfunction in advance, it is also difficult to predict the malfunction when the tester information and the prober information are separately managed.

Accordingly, in the present embodiment, when the failure (FAIL) is detected during the inspection, i.e., when a certain malfunction or a sign indicating a stage leading to the malfunction has occurred, a program in the malfunction analysis/prediction unit 400 is executed to deal with the malfunction problem. Further, as will be described later, PASS of the measurement result is divided into several levels, and the sign indicating the stage leading to the malfunction represents that the malfunction may occur in the near future even if the measurement result indicates PASS. The sign indicating the stage leading to the malfunction contributes to the prediction of the malfunction.

<Malfunction Analysis/Prediction Program>

Figure 4:
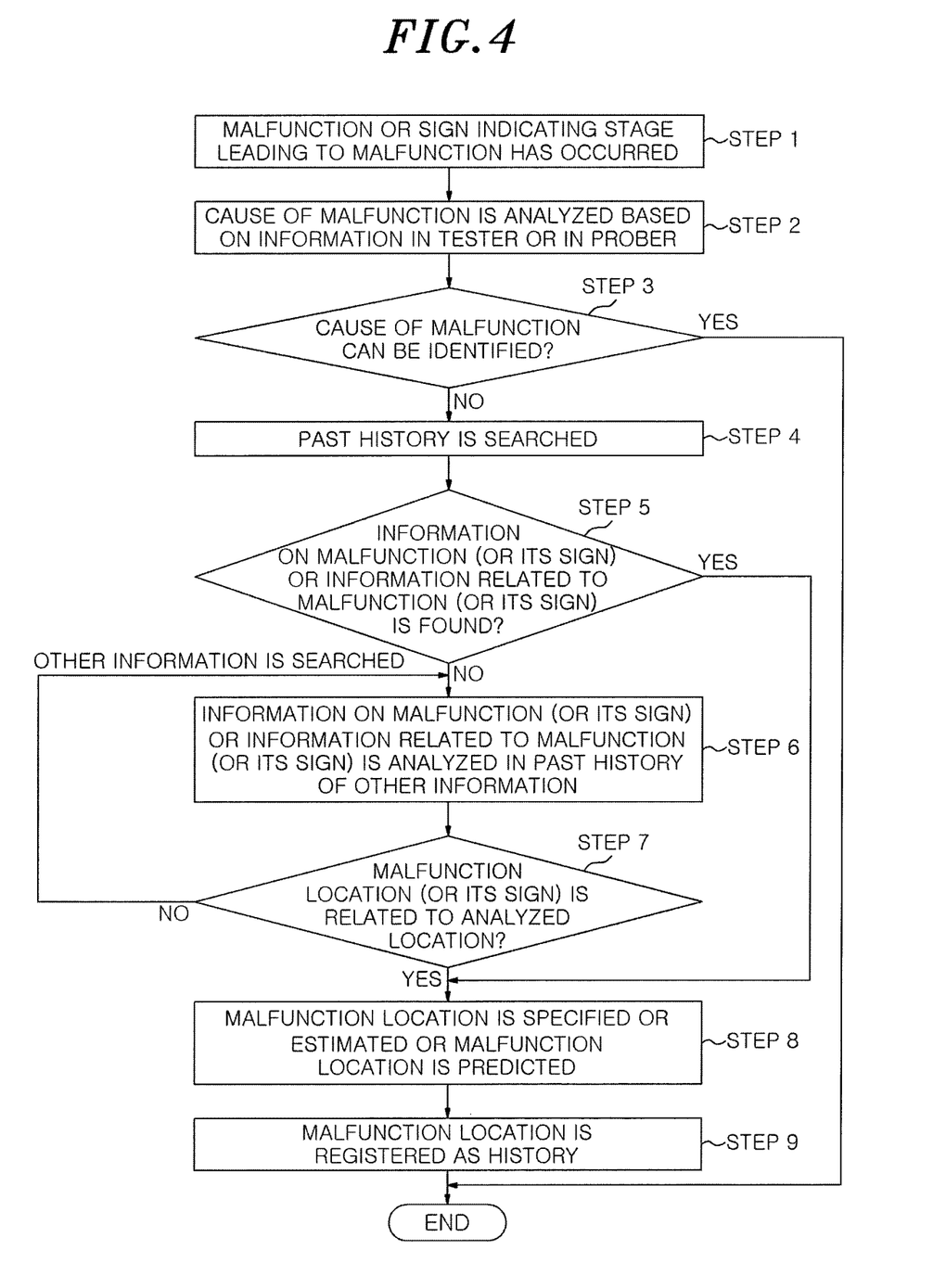
FIG. 4 is a flowchart of a malfunction analysis/prediction program.

FIG. 4 is a flowchart of a malfunction analysis/prediction program.

First, it is notified that a malfunction or a sign indicating a stage leading to the malfunction has occurred (step 1). Here, "malfunction" indicates that the measurement result is "FAIL" and includes not only the case where the original malfunction of the component of the system has occurred but also the case where "FAIL" is caused by dust or the like despite that the malfunction has not occurred in the system.

Next, information in the tester or in the prober is acquired, and the cause of the malfunction is analyzed using the acquired information (step 2). Then, it is determined whether or not the cause of the malfunction can be identified (step 3). If the cause of the malfunction can be identified (Yes in step 3), the process is terminated.

If the cause of the malfunction cannot be identified (No in step 3), the past history of the prober or the tester is searched from the history information storage and management unit 40 (step 4). Next, it is determined whether or not information on the currently occurred malfunction (or its sign) or information related to the currently occurred malfunction (or its sign) (step 5) can be found. If there is no information on or related to the currently occurred malfunction (No in step 5), the information on the currently occurred malfunction (or its sign) or the information related to the currently occurred malfunction (or its sign) is analyzed in the past history of the other information (i.e., either the tester information in the case that the prober information is initially analyzed or the prober information in the case that the tester information is initially analyzed) (step 6). Next, it is determined whether or not a malfunction (or its sign) location is related to the analyzed location (step 7). If the malfunction location and the analyzed location are related (Yes in step 7), the malfunction location is specified or estimated or the malfunction location is predicted (step 8), and, then, the malfunction location is registered as history (step 9). Thereafter, the result is displayed on, e.g., the display unit. In the case that the malfunction is predicted, it is possible to correct or deal with such malfunction before the occurrence of the malfunction.

If it is determined in step 5 that the information on or related to the currently occurred malfunction is found (Yes in step 5), the malfunction location is specified or estimated or the malfunction location is predicted (step 8) and, then, the malfunction location is registered as a history (step 9). Further, if it is determined in step 7 that the malfunction (or its sign) location and the analyzed location are not related (No in step 7), another information is searched to analyze the past history in step 6.

<Example of Malfunction Analysis and Prediction>

Next, an example of malfunction analysis and prediction will be described.

Figure 5:
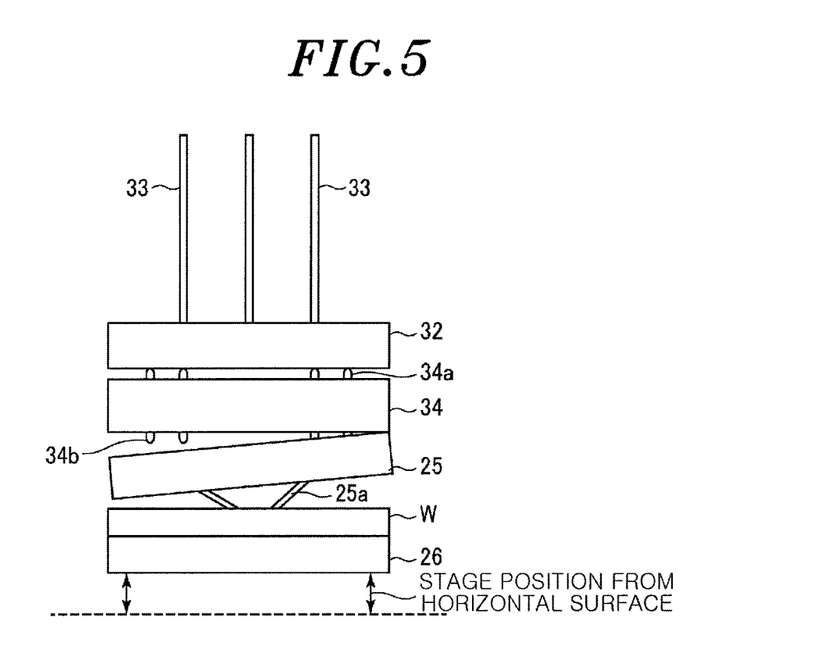
FIG. 5 shows a state in which a probe card is abnormally installed.

For example, as shown in FIG. 5, when the probe card 25 is abnormally installed, the wafer inspection results in a failure due to a contact failure (open) or an increase in a resistance of a transmission path from the tester to the wafer.

The following factors (1) to (5) may be considered to cause the contact failure or the increase in the resistance of the transmission path:

(1) Contact of the contact block 34 on the tester side
(2) Contact of the contact block 34 on the probe card side
(3) Contact between the probes 25*a* and the wafer W
(4) Uneven height of the stage 26 (chuck top)→determined from stage height information
(5) Tester output and measurement failure→determined from tester diagnosis result.

If it is already known from the tester diagnosis result and the stage height information on the stage 26 that the factors (4) and (5) are normal, it is estimated that the failure (malfunction) has occurred near the contact block 34 and the probe card 25.

Figure 6:
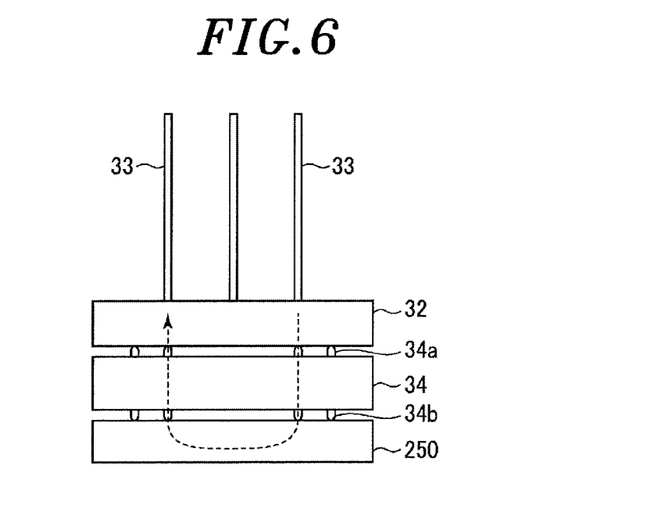
FIG. 6 shows a state in which a diagnosis is performed using a diagnostic probe card.

As shown in FIG. 6, if a result obtained from a diagnosis using a diagnostic probe card 250 is normal, it is clear that the factors (1) and (2) are normal. Then, the factor (3) can be estimated (specified) as the factor of the contact failure of the probe card, and the malfunction location can be identified. By setting different levels of PASS, as will be described later, the malfunction location can be predicted.

As described above, the malfunction location can be identified and predicted based on the information from the tester 300 and the prober 200 and the assessment on the factor analysis process performed by the system expert such as the service developer or the like.

<Malfunction Prediction>

Next, the malfunction prediction will be described in detail.

The devices (DUTs) on the wafer W are inspected by the tester 300, and the inspection results are obtained from the respective devices. Further, even when the inspection result shows 'OK (PASS)', 'OK' has multiple levels from a level with no FAIL to a level close to FAIL.

Figure 7:
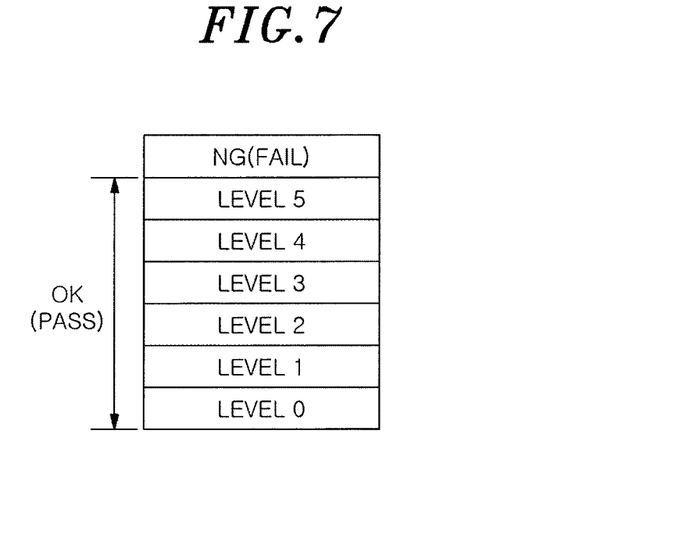
FIG. 7 shows an example in which multiple levels of 'OK (PASS)' are set for inspection items.

For example, as shown in FIG. 7, 'OK (PASS)' has six levels for multiple inspection items. In FIG. 7, a level '0' indicates a level at which malfunction hardly occurs. As the level increases from '1' to '5', the inspection result becomes closer to FAIL.

For example, for a certain inspection item (function), measurement results obtained for multiple days or multiple times are used. If all of the measurement results are level '0,' it is determined that this certain inspection item (function) is normal with a higher degree and the possibility of malfunction is currently low. However, if the level of the measurement results increases to levels 1, 2 and 3 as time elapses, there is a high possibility that malfunction (FAIL) will occur in the future. Therefore, when the time interval between the level increases reaches a predetermined value, it is determined that it is a sign indicating a stage leading to the malfunction. Accordingly, the malfunction occurrence timing can be predicted, which makes it possible to replace and repair the components in advance. Similarly, the multiple levels are set for the other inspection items, and measurement results for each inspection item are compared and referred to in a similar manner as described above. Accordingly, the location of the cause of the malfunction can also be specified.

For example, it is assumed that a user has inspected a wafer using the inspection system and has reached a conclusion that a yield is poorer than before. For example, when a location where a contact resistance is large exists in the configuration shown in FIG. 3, it is difficult in the conventional case to identify the malfunction location and predict the malfunction. This is because, in the conventional case, although all devices on the wafer are inspected for each diagnosis item, the results are merely 'PASS' and 'FAIL.' Therefore, stepwise evaluation cannot be performed in the conventional case.

However, by setting multiple levels of 'PASS' as described in the present embodiment, it is possible to identify the sign indicating the stage leading to the malfunction. Further, the malfunction location can also be specified by combining multiple items. Accordingly, the malfunction of a specific component (e.g., the probe card or the inspection circuit boards) can be predicted by the malfunction analysis/prediction unit 400.

<Analysis Result Display Using Wafer Map>

The technique for dividing 'PASS' into multiple levels may be used for a wafer map, and the analysis result can be displayed on the wafer map. The malfunction analysis is basically performed on a device (DUT) basis. Therefore, when multiple DUTs are determined as 'PASS' but it is determined that there is a sign indicating a stage leading to the malfunction due to the level of 'PASS' being high, the cause of the malfunction can be identified on the wafer map that displays the multiple DUTs on the wafer. The wafer map can selectively display only the recent result or combination of the recent result and the past result.

Figure 8:
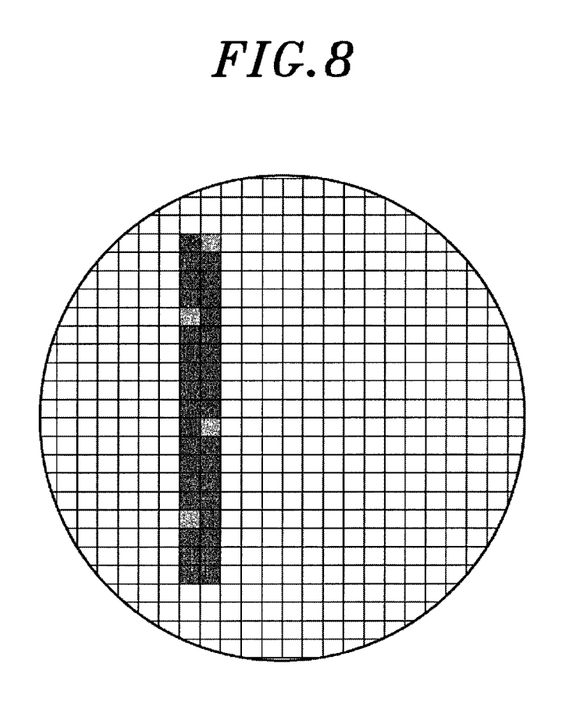
FIG. 8 show an example of an analysis result display using a wafer map in the case where darker portions (FAIL or higher level) are generated linearly on the wafer map.
Figure 9:
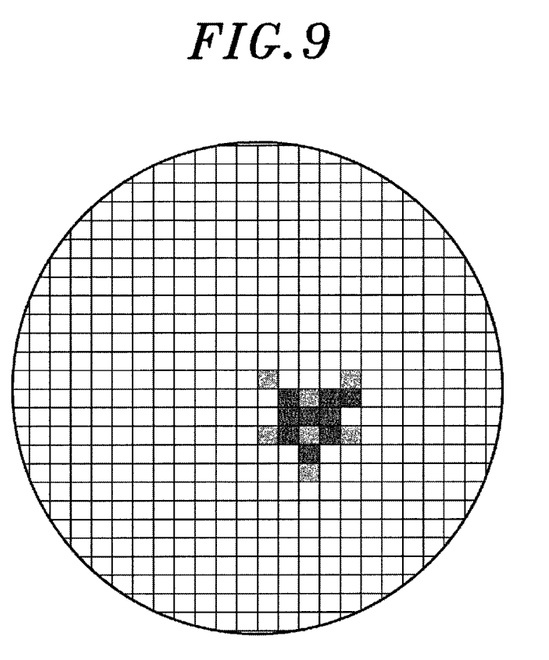
FIG. 9 shows an example of an analysis result display using the wafer map in the case where darker portions (FAIL or higher level) are generated in a spot-like manner on a part of the wafer map.
Figure 10:
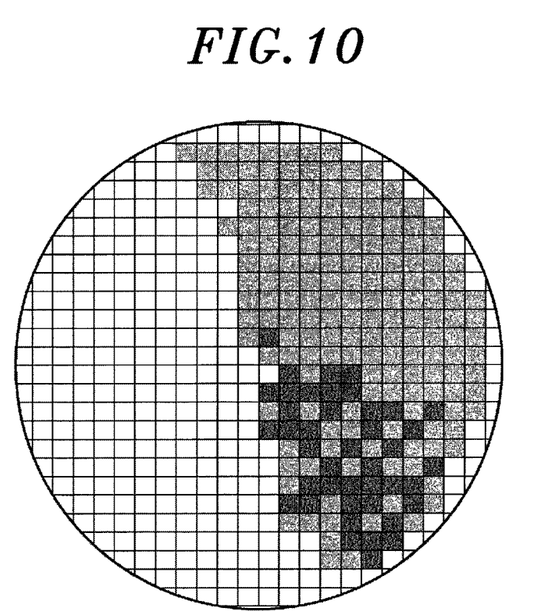
FIG. 10 shows an example of an analysis result display using the wafer map in the case where darker portions (FAIL or higher level) are generated on the substantially entire right side of the wafer map.

FIGS. 8 to 10 show examples of the analysis and the prediction of the malfunction while using the wafer map capable of displaying the levels in the case where multiple DUTs are determined as 'FAIL' or in the case where multiple DUTs are determined as 'PASS' but it is determined that there is a sign of the stage leading to the malfunction due to the level of 'PASS' being high. In FIGS. 8 to 10, the darker portions indicate the higher levels shown in FIG. 7.

FIG. 8 shows the case where dark portions (high levels) are generated linearly on the wafer map. The multiple inspection circuit boards 33 correspond to different linear-shaped regions of the DUTs on the wafer. Therefore, the linear-shaped darker portions indicate the malfunction of one of the inspection circuit boards 33 or the stage leading to the malfunction.

FIG. 9 shows the case where darker portions (higher levels) are generated in a spot-like manner on a part of the wafer map. This is considered to be due to foreign substances at the tip ends of the contact pins causing poor contact of the neighboring contact pins.

FIG. 10 shows the case where darker portions (high levels) are generated on the substantially entire right side of the wafer map. This is considered to be due to contact of the wafer or the contact of the probe card not being uniform as shown in FIG. 5, for example.

<Height of Stage (Wafer Chuck Top)>

Figure 11:
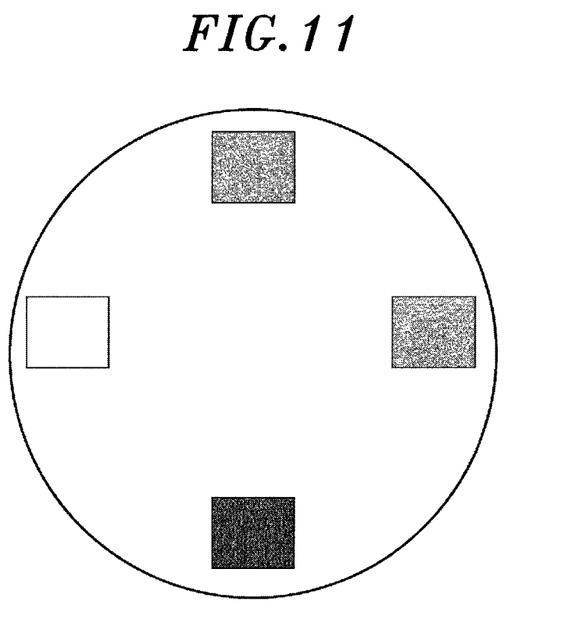
FIG. 11 shows an example of a variation in height positions of a stage (wafer chuck top).
Figure 12:
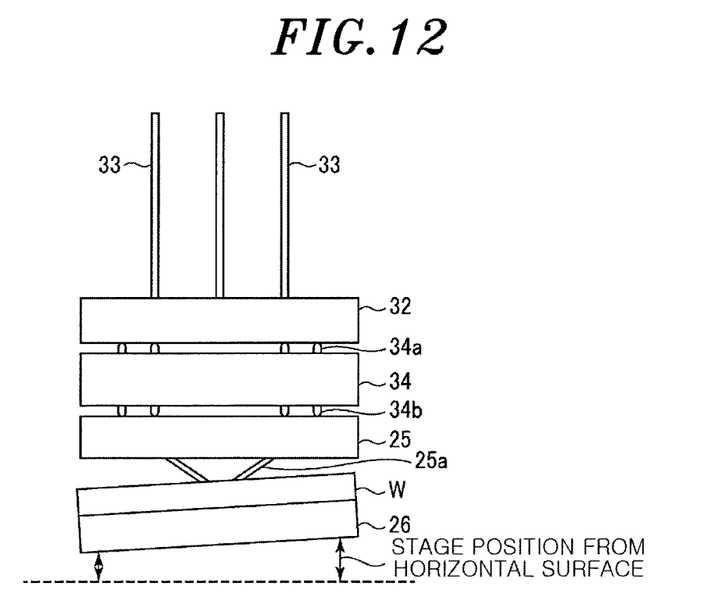
FIG. 12 shows an example of the case where the height of the stage (wafer chuck top) is not even.

The height of the stage is displayed by determining the variation in the average of heights measured at four points of the stage as the six levels (levels 0 to 5) and 'FAIL' as shown in FIG. 7. FIG. 11 shows an example thereof. In FIG. 11, the darker portions indicate the higher levels shown in FIG. 7. FIG. 12 shows an example of the case where the height of the stage is not even. If the height of the stage is not even as shown in FIG. 12, the variation can be observed visually. By combining the result shown in FIG. 10 with FIG. 11 and FIG. 12, it can also be considered that the variation in the height of the stage 26 affects the configuration from the contact block to the tester.

As described above, in accordance with the present embodiment, when the malfunction has occurred, the cause of the malfunction is specified based on the history information of the prober and the history information of the tester, so that it is possible to quickly specify or estimate the malfunction location. In addition, when a sign indicating a stage leading to the malfunction has occurred, it is possible to predict the malfunction location before the occurrence of the malfunction, which makes it possible to replace or repair target components in advance. Accordingly, the operation rate of the inspection system can be improved.

<Other Applications>

The present invention is not limited to the above-described embodiment, and various modifications can be made within the scope of the present invention. For example, in the above-described embodiments, the flowchart of FIG. 4 is merely an example, and the present invention is not limited thereto as long as it is possible to analyze and predict the malfunction from the information of the prober and the information of the tester. Further, the configuration of the inspection system is not limited to that in the above-described embodiments, and the inspection system may include multiple probers and multiple testers. Although the semiconductor wafer is used as a substrate in the above-described embodiments, the substrate is not limited to the semiconductor wafer.

DESCRIPTION OF REFERENCE NUMERALS

21: main body,
22: transport unit
23: housing,
24: head plate
25: probe card,
25a: probe
26: stage (wafer chuck top)
27: prober control unit
31: housing,
32: motherboard
33: inspection circuit board
34: contact block
35: tester control unit
40: history information storage and management unit
100: inspection system
200: prober,
300: tester
400: malfunction analysis/prediction unit
500: host control unit

The invention claimed is:

1. An inspection system comprising:
a prober including a stage configured to hold a substrate on which multiple devices are formed, a transport unit configured to transfer the substrate to the stage, and a probe card configured to bring a plurality of probes into contact with electrodes of the multiple devices on the substrate;
a tester configured to apply electrical signals to the multiple devices on the substrate through the probe card to inspect electrical characteristics of the multiple devices;
a processor configured to analyze, when a malfunction or a sign indicating a stage leading to the malfunction has occurred during an inspection, history information of the probe and history information of the tester related to the malfunction to specify or estimate a location of the malfunction or predict the location of the malfunction.

2. The inspection system of claim 1, wherein the processor specifies or estimates the location of the malfunction or predicts the location of the malfunction based on the history information and an assessment of an operator.

3. The inspection system of claim 2, wherein when there are multiple causes of the malfunction, a cause of the malfunction is specified based on the assessment of the operator to specify or estimate, or predict the location of the malfunction.

4. The inspection system of claim 1, wherein the tester includes a motherboard, multiple inspection circuit boards mounted on the motherboard, and a contact member disposed between a probe card mounted on the prober and the motherboard to connect the probe card and the motherboard,
wherein the location of the malfunction that has occurred in any one of the inspection circuit boards, the motherboard, the contact member, and the probe card is specified or estimated, or predicted.

5. The inspection system of claim 4, wherein when a contact failure or a malfunction due to a resistance of a transmission path from the tester to an inspection target object increasing has occurred during an inspection of the multiple devices formed on the substrate, multiple factors including factors of the prober side and factors of the tester side related to the contact failure or the malfunction are identified, and the location of the malfunction is specified or estimated or the location of the malfunction is predicted from, among the multiple factors, factors excluding factors already determined as normal and factors determined as normal by obtaining a normal result from predetermined diagnosis.

6. The inspection system of claim 1, wherein an output result of an inspection item that is determined as 'PASS' during the inspection is divided into multiple levels, a sign of the malfunction is identified, and the malfunction is predicted based on level changes caused by multiple measurement results for the inspection item.

7. The inspection system of claim 6, wherein the output result of the inspection item that is determined as 'PASS' during the inspection is divided into the multiple levels on a map that displays the multiple devices formed on the substrate, and the location of the malfunction is predicted based on a distribution of the levels of the devices determined as 'PASS'.

8. The inspection system of claim 7, wherein the location of the malfunction is predicted by associating the distribution of the levels on the map with a variation in heights of the stage of an inspection target object of the prober.

9. A malfunction analysis/prediction method for identifying or predicting a location of a malfunction in an inspection system, wherein the inspection system includes a prober including a stage configured to hold a substrate on which multiple devices are formed, a transport unit configured to transfer the substrate to the stage, a probe card configured to bring a plurality of probes into contact with electrodes of the multiple devices on the substrate; and a tester configured to apply electrical signals to the multiple devices on the substrate through the probe card to inspect electrical characteristics of the multiple devices, wherein the malfunction analysis/prediction method includes analyzing, when the malfunction or a sign indicating a stage leading to the malfunction has occurred during an inspection, history information of the prober and history information of the tester related to the malfunction to specify or estimate the location of the malfunction, or predict the location of the malfunction.

10. The malfunction analysis/prediction method of claim 9, wherein the location of the malfunction is specified or estimated or the location of the malfunction is predicted based on the history information and an assessment of an operator.

11. The malfunction analysis/prediction method of claim 10, wherein when there are multiple causes of the malfunction, a cause of the malfunction is specified based on the assessment of the operator to specify or estimate, or predict the location of the malfunction.

12. The malfunction analysis/prediction method of claim 10, wherein an output result of an inspection item that is determined as 'PASS' during the inspection is divided into multiple levels, a sign of the malfunction is identified, and the malfunction is predicted based on level changes caused by multiple measurement results for the inspection item.

13. The malfunction analysis/prediction method of claim 12, wherein the output result of the inspection item that is determined as 'PASS' during the inspection is divided into the multiple levels on a map that displays the multiple devices formed on the substrate, and the location of the malfunction is predicted based on a distribution of the levels of the devices determined as 'PASS'.

14. The malfunction analysis/prediction method of claim 13, wherein the location of the malfunction is predicted by associating the distribution of the levels on the map with a variation in heights of the stage of an inspection target object of the prober.

15. The malfunction analysis/prediction method of claim 9, wherein the tester includes a motherboard, multiple inspection circuit boards mounted on the motherboard, and a contact member disposed between a probe card mounted on the prober and the motherboard to connect the probe card and the motherboard, wherein the location of the malfunction that has occurred in any one of the inspection circuit boards, the motherboard, the contact member, and the probe card is specified or estimated, or predicted.

16. The malfunction analysis/prediction method of claim 15, wherein when a contact failure or a malfunction due to a resistance of a transmission path from the tester to an inspection target object increasing has occurred during an inspection of the multiple devices formed on the substrate, multiple factors including factors of the prober side and factors of the tester side related to the contact failure or the malfunction are identified, and the location of the malfunction is specified or estimated or the location of the malfunction is predicted from, among the multiple factors, factors excluding factors already determined as normal and factors determined as normal by obtaining a normal result from predetermined diagnosis.

* * * * *